US010120751B2

United States Patent
Khan et al.

(10) Patent No.: US 10,120,751 B2
(45) Date of Patent: Nov. 6, 2018

(54) TECHNIQUES TO RECOVER DATA USING EXCLUSIVE OR (XOR) PARITY INFORMATION

(71) Applicant: INTEL CORPORATION, Santa Clara, CA (US)

(72) Inventors: Jawad B. Khan, Cornelius, OR (US); Anand S. Ramalingam, Beaverton, OR (US); Pranav Kalavade, San Jose, CA (US)

(73) Assignee: INTEL CORPORATION, Santa Clara, CA (US)

( * ) Notice: Subject to any disclaimer, the term of this patent is extended or adjusted under 35 U.S.C. 154(b) by 234 days.

(21) Appl. No.: 14/866,291

(22) Filed: Sep. 25, 2015

(65) Prior Publication Data

US 2017/0091022 A1  Mar. 30, 2017

(51) Int. Cl.
*G06F 11/10* (2006.01)
*G06F 3/06* (2006.01)
*G11C 29/52* (2006.01)

(52) U.S. Cl.
CPC ........ *G06F 11/1068* (2013.01); *G06F 3/0619* (2013.01); *G06F 3/0644* (2013.01); *G06F 3/0688* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 5,856,989 A * | 1/1999 | Oldfield | ............ | G06F 11/1076 714/799 |
| 6,223,323 B1 * | 4/2001 | Wescott | ............ | G06F 11/1076 714/770 |
| 8,898,381 B2 * | 11/2014 | Leach | ............... | G06F 11/1008 711/100 |
| 8,938,582 B2 * | 1/2015 | Kopylovitz | ......... | G06F 12/0866 711/113 |
| 9,471,448 B2 * | 10/2016 | Williams | ............ | G06F 3/0619 |
| 2012/0204078 A1 | 8/2012 | Hall et al. | | |
| 2014/0006848 A1 | 1/2014 | Ramanujan et al. | | |
| 2015/0134885 A1 | 5/2015 | Yeung et al. | | |
| 2015/0149818 A1 | 5/2015 | Kalavade et al. | | |
| 2015/0154066 A1 * | 6/2015 | Grimsrud | ............ | G06F 11/108 714/764 |
| 2015/0169408 A1 | 6/2015 | Frickey, III et al. | | |
| 2017/0046221 A1 * | 2/2017 | Bandic | ............... | G06F 11/1068 |

OTHER PUBLICATIONS

International Search Report and Written Opinion received for PCT Patent Application No. PCT/US2016/053837, dated Jan. 17, 2017, 15 pages.

* cited by examiner

*Primary Examiner* — Justin R Knapp

(57) ABSTRACT

Examples may include techniques to recover data from a solid state drive (SSD) using exclusive OR (XOR) parity information. Data saved to non-volatile types of block-erasable memory such as NAND memory included in the SSD may be recovered via use of XOR parity information saved to types of write-in-place memory such as a 3-dimensional cross-point memory also included in the SSD.

23 Claims, 9 Drawing Sheets

Scheme 400

| | B-E Memory Dies 410 | | | | | | | | | | | | | | | |
|---|---|---|---|---|---|---|---|---|---|---|---|---|---|---|---|---|
| | B-E Die 410-1 | | | | B-E Die 410-2 | | | | B-E Die 410-3 | | | | B-E die 410-n | | | |
| | plane0 | plane1 | plane2 | plane3 | plane0 | plane1 | plane2 | plane3 | plane0 | plane1 | plane2 | plane3 | plane0 | plane1 | plane2 | plane3 |
| Stripe N | x0 | x0 | x0 | x0 | x0 | x0 | x0 | x0 | x0 | x0 | x0 | x0 | x0 | x0 | x0 | x0 |
| Stripe N+1 | x1 | x1 | x1 | x1 | x1 | x1 | x1 | x1 | x1 | x1 | x1 | x1 | x1 | x1 | x1 | x1 |
| Stripe N+2 | x2 | x2 | x2 | x2 | x2 | x2 | x2 | x2 | x2 | x2 | x2 | x2 | x2 | x2 | x2 | x2 |
| Stripe N+3 | x3 | x3 | x3 | x3 | x3 | x3 | x3 | x3 | x3 | x3 | x3 | x3 | x3 | x3 | x3 | x3 |
| Stripe N+4 | x4 | x4 | x4 | x4 | x4 | x4 | x4 | x4 | x4 | x4 | x4 | x4 | x4 | x4 | x4 | x4 |
| Stripe N+5 | x5 | x5 | x5 | x5 | x5 | x5 | x5 | x5 | x5 | x5 | x5 | x5 | x5 | x5 | x5 | x5 |
| Stripe N+6 | x6 | x6 | x6 | x6 | x6 | x6 | x6 | x6 | x6 | x6 | x6 | x6 | x6 | x6 | x6 | x6 |
| Stripe N+7 | x7 | x7 | x7 | x7 | x7 | x7 | x7 | x7 | x7 | x7 | x7 | x7 | x7 | x7 | x7 | x7 |

| W-i-P Die 420 | |
|---|---|
| p0 | Addr. 401-1 |
| p1 | Addr. 401-2 |
| p2 | Addr. 401-3 |
| p3 | Addr. 401-4 |
| p4 | Addr. 401-5 |
| p5 | Addr. 401-6 |
| p6 | Addr. 401-7 |
| p7 | Addr. 401-8 |

STORE DATA TO A PLURALITY OF B-E MEMORY DIES THAT INDIVIDUALLY INCLUDE MULTIPLE MEMORY PLANES, EACH MEMORY PLANE INCLUDING AT LEAST FIRST AND SECOND MEMORY PAGES TO STORE THE DATA
702

GENERATE XOR PARITY INFORMATION BASED ON DATA STORED TO FIRST AND SECOND MEMORY PAGES OF A FIRST NUMBER OF PLANES SPANNING ACROSS MORE THAN ONE B-E MEMORY DIE FROM AMONG THE PLURALITY OF B-E MEMORY DIES, THE DATA STORED TO THE FIRST AND SECOND MEMORY PAGES COMPRISING FIRST AND SECOND XOR STRIPES
704

STORE THE XOR PARITY INFORMATION FOR THE FIRST AND SECOND XOR STRIPES AT ONE OR MORE PHYSICAL MEMORY ADDRESSES OF A W-i-P MEMORY DIE
706

RECOVER DATA STORED TO THE FIRST OR SECOND MEMORY PAGES USING THE XOR PARITY INFORMATION STORED TO THE W-i-P MEMORY DIE, THE DATA RECOVERED RESPONSIVE TO AN UNCORRECTABLE ERROR TO A PORTION OF THE DATA STORED TO THE FIRST OR SECOND MEMORY PAGES
708

*FIG. 7*

Storage Medium 800

*Computer Executable Instructions for 700*

*FIG. 8*

TECHNIQUES TO RECOVER DATA USING EXCLUSIVE OR (XOR) PARITY INFORMATION

TECHNICAL FIELD

Examples described herein are generally related to recovering data stored to a memory or storage device following an uncorrectable error to at least a portion of the data.

BACKGROUND

Exclusive OR (XOR) parity information may be used as part of a technique to improve reliability of a storage device such as a solid state drive (SSD) including types of block-erasable non-volatile memory such as NAND flash memory (hereinafter "NAND memory"). The reliability may be provided by using XOR parity information generated or computed based on data stored to the SSD. SSDs including NAND memory may be arranged such that a smallest unit that may be erased may be referred to as a block. Each block may include several memory pages (e.g., 64, 128 or more). These blocks may be grouped into several planes (e.g., 4 or more) within a NAND memory die or device. Each plane may be an independent unit and may be capable of executing various NAND operations, independent of other planes within the NAND memory die.

A smallest unit that may be written in NAND memory is a memory page. As mentioned above, several memory pages may be included in a block. Also, all memory pages in a given block may only be erased as a group responsive to an erase command. Memory pages in a block may be written with data in sequential manner starting from an initial memory page such as memory page 0 or memory page 1. Memory pages (or portions thereof) having data may be read in a random manner.

BRIEF DESCRIPTION OF THE DRAWINGS

FIG. 4 illustrates an example second scheme.
FIG. 7 illustrates an example of a logic flow.
FIG. 8 illustrates an example of a storage medium.

DETAILED DESCRIPTION

Figure 1:
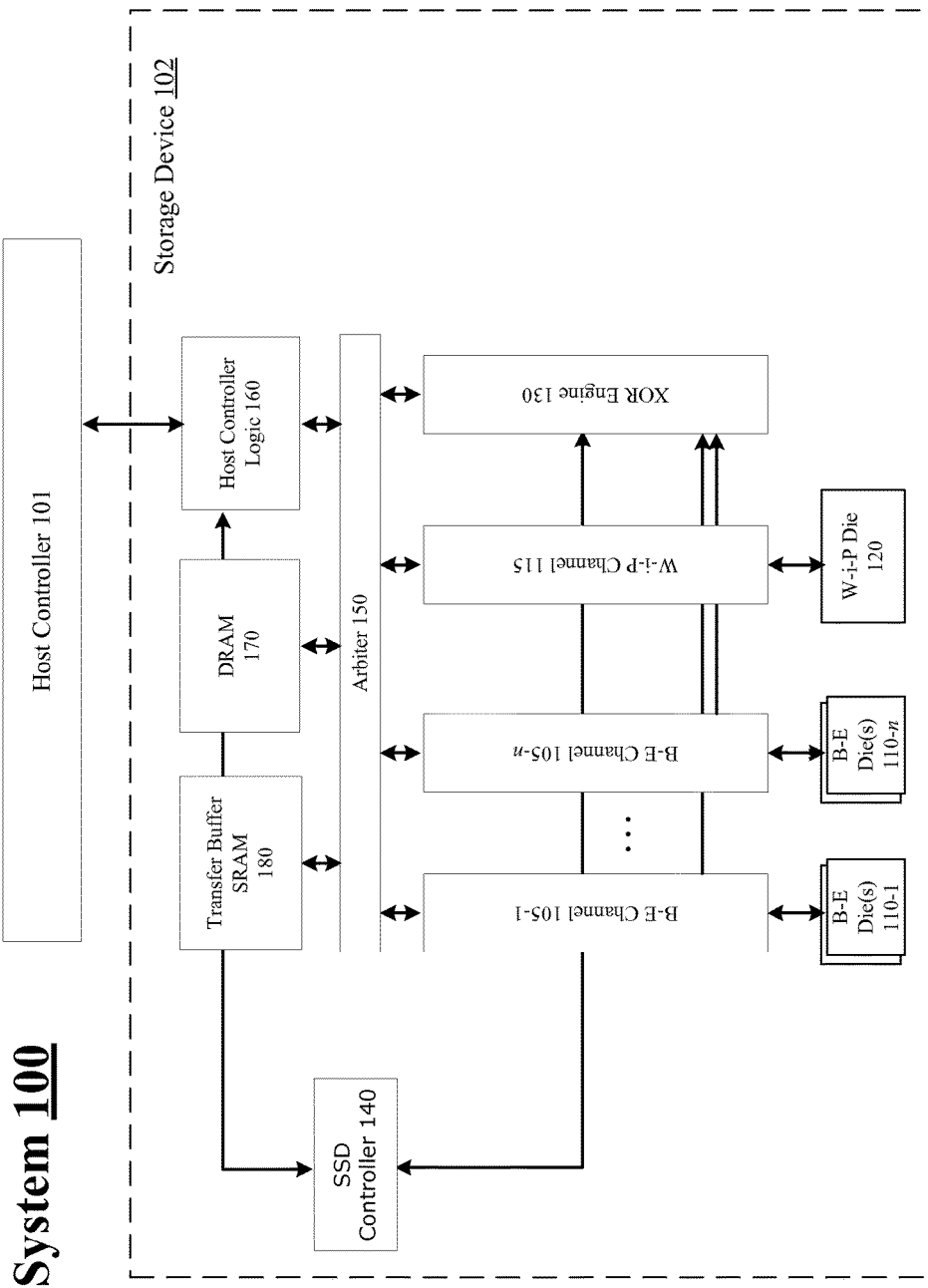
FIG. 1 illustrates an example first system.

As contemplated in the present disclosure, XOR parity information may be used as part of a technique to improve reliability of an SSD including non-volatile types of block-erasable memory such as NAND memory. Generally, data included in NAND memory planes that span across multiple NAND memory devices or dies may be XORed together to compute XOR parity information. An XOR stripe may include data stored in given memory pages for these NAND memory planes spanning across the multiple NAND memory devices or dies that are XORed together to compute XOR parity information. For example, data from first memory pages of each plane across the multiple NAND memory dies or devices may be XORed together and this data may form a first XOR stripe. Data from second memory pages of each plane may also be XORed together and this data from the second memory pages may form a second XOR stripe. In the event that an uncorrectable error is attributed to at least a portion data in the first or second XOR stripes, the computed XOR parity information generated from the respective first or second XOR stripe may be used to recover the portion of data.

Typically, in order to protect data stored to an SSD including NAND memory, XOR parity information should be stored in independent planes of NAND memory dies or devices. For example, typical XOR schemes have been deployed that use an equivalent of a full plane of a NAND memory die to store XOR parity information. If a NAND memory die has 4 planes, then a quarter of the NAND memory die (one of four planes) is used to store the XOR parity information to protect data from uncorrectable errors. As technology advances in NAND memory dies lead to larger and larger memory capacities for a given die, the amount of NAND memory die to protect data may become unacceptably high. For example, if a single NAND memory die has a memory capacity of 128 gigabytes (GB), 32 GB are reserved to protect data for that single NAND memory die and cannot be used to store data. Given that some SSDs may have dozens of NAND memory dies several terabytes of the total memory capacity of the SSD may be reserved for protecting data. Some SSD users may be unwilling to pay for a potentially high cost of this rather large amount of memory capacity to protect data from uncorrectable errors.

Another potential complication with use of NAND memory to store parity information to protect data is that once a block in a plane has been opened for writing XOR parity information, all pages in this block must be written sequentially. This sequential writing may preclude any random writes to these blocks to update XOR parity information due to data in a given XOR stripe becoming stale and being discarded or over written by a host coupled with an SSD including NAND memory. Also, in traditional garbage collection for NAND memory, all valid data has to be moved out of an XOR stripe and then the XOR parity information is re-computed. This moving of the valid data may take time and may waste computing resources due to the re-computing of the XOR parity information. Further, because in-place-write is typically not possible with NAND memory, each XOR stripe needs to maintain its XOR parity individually. This may be due to the next XOR stripe not being started until the current XOR stripe is finished. Therefore, storing multiple XOR stripes' worth of XOR parity information in a controller for the SSD may be impractical. It is with respect to these and other challenges that the examples described herein are needed.

FIG. 1 illustrates an example system 100. In some examples, as shown in FIG. 1, system 100 includes a host controller 101 coupled to a storage device 102. Also, as shown in FIG. 1, storage device 102 may include B-E die(s) 110-1 to 110-n, where "n" may be any whole positive integer greater than 1. Block-erasable (B-E) die(s) 110-1 to 110-n may represent types of block-erasable memory (e.g., NAND or NOR) memory dies or devices arranged to store data accessible via respective B-E channels 105-1 to 105-n. Storage device 102 may also include another type of non-volatile memory such as write-in-place (W-i-P) memory. W-i-P memory may include, but is not limited to 3-dimensional (3-D) cross-point memory, magnetorestive random access memory (MRAM) or spin transfer torque-MRAM (STT-MRAM) in W-i-P die 120. W-i-P die 120 may represent a W-i-P memory die or device accessible via W-i-P channel 115.

According to some examples, an SSD controller 140 may include logic and/or features to facilitate reading, modifying or writing to B-E die(s) 110-1 to 110-n and W-i-P die 120 via B-E channels 105-1 to 105-n and W-i-P channel 115. For these examples, an arbiter 150, a host controller logic 160, a dynamic random access memory (DRAM) 170 and/or a transfer buffer static random access memory (SRAM) may also facilitate reading, modifying or writing to B-E die(s) 110-1 to 110-n and W-i-P die 120.

In some examples, as described more below, XOR parity information to recover data stored to B-E memory dies or devices such as B-E die(s) 110-1 to 110-n may be stored to a 3 W-i-P memory die or device such as W-i-P die 120. For these examples, an XOR engine such as XOR engine 130 may include logic and/or features capable of generating the XOR parity information based on XOR stripes associated with pages and planes for B-E memory spanning across a plurality of the B-E memory dies. Saving the XOR parity information to W-i-P die 120 may eliminate the above-mentioned costs for using a portion of a given B-E memory die (e.g., $1/4^{th}$) from among B-E die(s) 110-1 to 110-n for saving the XOR parity information. Also W-i-P memory may not suffer from writing pages in sequence as may be required for B-E memory and also may not suffer from needing to delete or erase pages as groups in the form of blocks as is the case with B-E memory. Further, random read, write and erase access may be possible with W-i-P memory. As described more below, this may allow for multiple XOR stripes to be efficiently XORed together in a single physical location in the W-i-P memory, due to in-place-write capabilities for W-i-P memory. As a result, additional or less XOR parity information may be stored to the single physical location to reach a desired cost and/or desired reliability (e.g., level of data protection to recover data responsive to uncorrectable errors).

Figure 2:
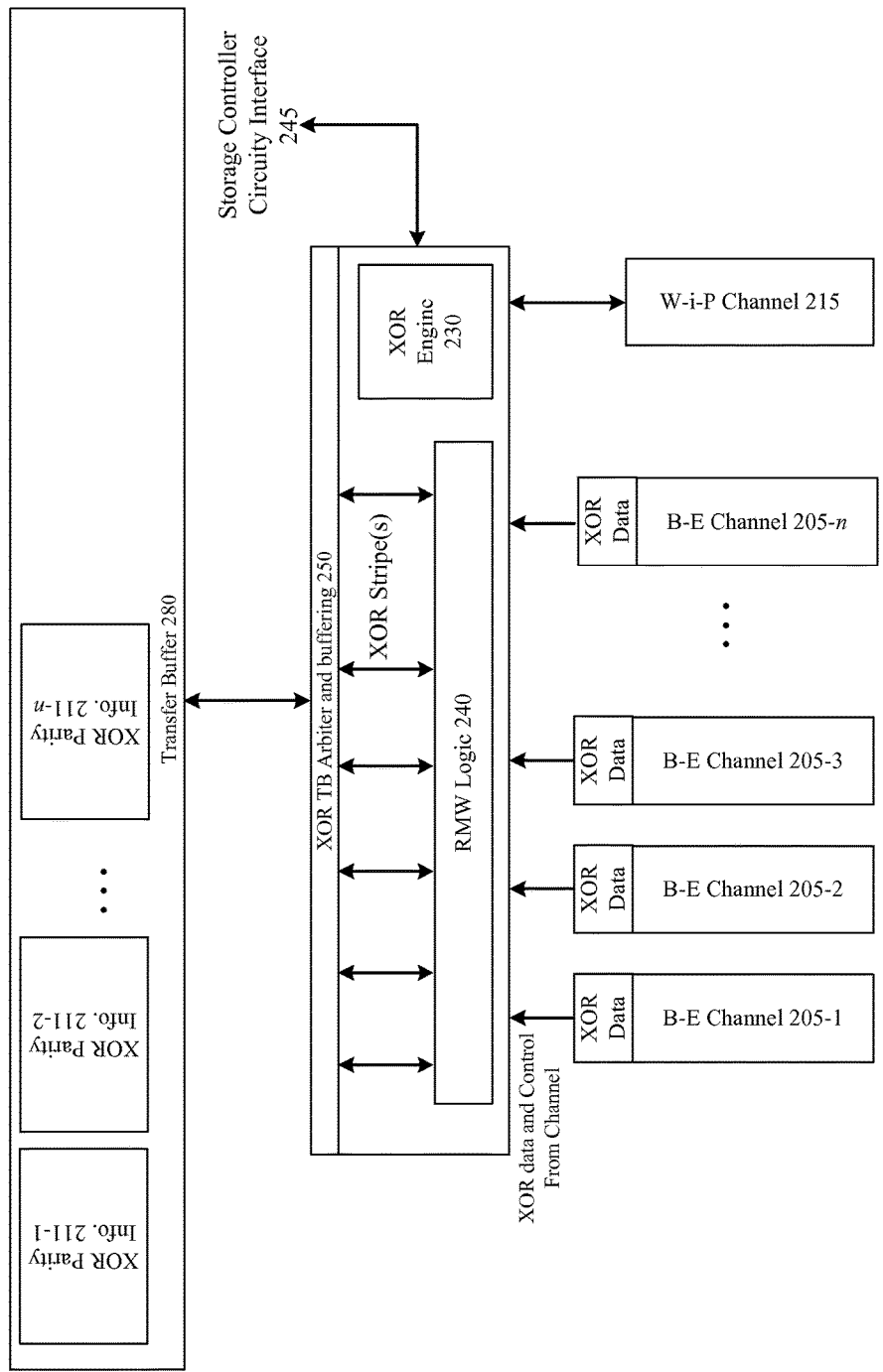
FIG. 2 illustrates an example second system

FIG. 2 illustrates an example system 200. In some examples, as shown in FIG. 2, system 200 includes B-E channels 205-1 to 205-n having XOR data ready for delivery to and/or accessible to read modify write (RMW) logic 240. For these examples, the XOR data may be associated with data stored to one or memory pages of planes included in B-E memory dies accessible via B-E channels 205-1 to 205-n (not shown). The XOR data, for example, may be read, modified or written to by RMW logic 240. The XOR data may also be grouped together to form one or more XOR stripes. These XOR stripe(s) may then be used by logic or features of XOR engine 230 to generate XOR parity information. As shown in FIG. 2, XOR parity information may be routed through an XOR transfer buffer (TB) arbiter and buffering 250 to be at least temporarily stored to transfer buffer 280. For example, XOR parity information 211-1 to 211-n may include the XOR parity information generated by XOR engine 230 based on these XOR stripe(s).

According to some examples, RMW logic 240 may be included as part of logic and/or features of a storage controller (not shown) and may interface with a processor or circuitry for the storage controller via storage controller circuitry interface 245. For these examples, any modifications or writes to XOR data associated with data stored to the one or more memory pages or planes included in B-E memory dies or devices accessible via B-E channels 205-1 to 205-n may be initiated by the storage controller and implemented by RMW logic 240. XOR engine 230 may be notified of these modifications or writes and may then generate XOR parity information responsive to these modifications or writes to the XOR data.

In some examples, the storage controller may cause XOR parity information included in XOR parity information 211-1, 211-2 or 211-n to be saved to a W-i-P die (not shown). For these examples, logic and/or features of the storage controller may direct RMW logic 240 to store XOR parity information 211-1, 211-2 or 211-n to the W-i-P die through W-i-P channel 215. The storage controller may indicate specific physical memory addresses in the W-i-P memory die to store XOR parity information 211-1, 211-2 or 211-n. These specific physical memory addresses, as described more below, may be based on a scheme that may cause this XOR parity information to be stored in separate physical memory addresses for enhanced protection of data or in a same physical memory address for reduced protection but also possibly using less memory capacity of the W-i-P memory die or device. The specific physical memory addresses may be determined, for example, based on a data structure such as a lookup table (LUT) that indicates a mapping of XOR parity information generated to protect data stored to specific XOR stripes to be stored to specific physical memory addresses.

According to some examples, to facilitate recovery of XOR data protected by the XOR parity information, the storage controller may cause the LUT that indicates mapping of XOR parity information to be stored to the W-i-P memory die or device. This storage to the W-i-P memory may be part of a power loss imminent (PLI) mechanism that may facilitate data recovery following a power failure of a storage device.

Figure 3:
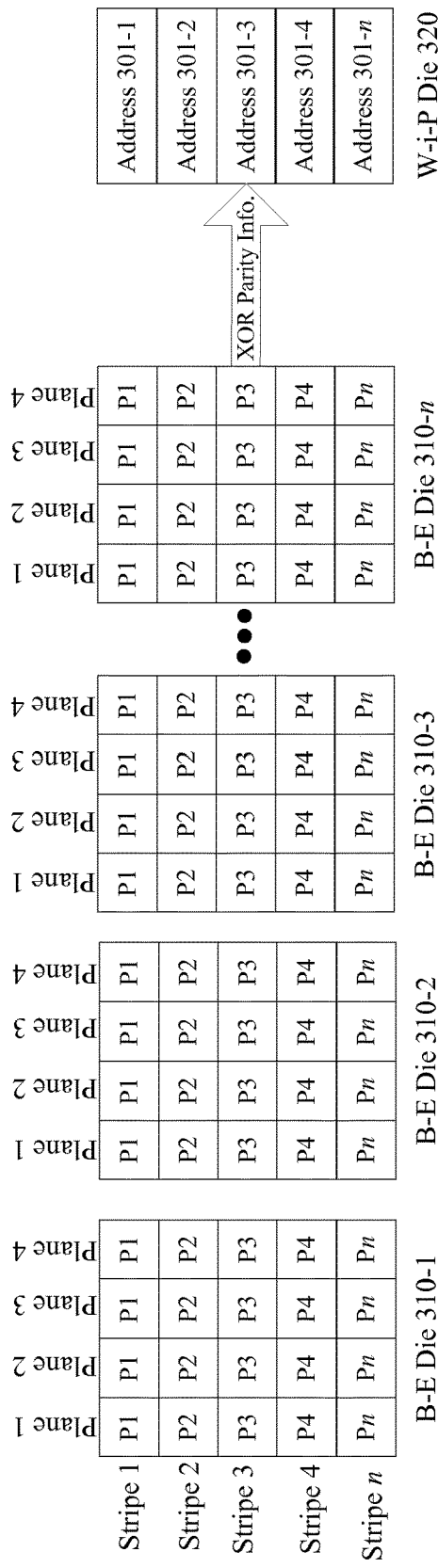
FIG. 3 illustrates an example first scheme.

FIG. 3 illustrates an example scheme 300. In some examples, scheme 300 depicts an example of how XOR stripes may be assigned to or associated with data stored to a plurality of B-E dies 310-1 to 310-n in order to generate XOR parity information for eventual storage at a W-i-P die 320 having physical memory address 301-1 to 301-n. For these examples, as shown in FIG. 3, individual B-E memory dies of B-E memory dies 310-1 to 310-n may each include planes identified as planes 1-4. Each of these planes may include a plurality of pages identified as P1 to Pn.

According to some examples, XOR parity information (e.g., generated by an XOR engine) may be based on a first number of planes of more than one individual B-E memory die having data stored to first memory pages for the first number of planes XORed together and having data stored to second memory pages for the first number of planes XORed together. For example, the first number of planes may include planes from B-E dies 310-1 to 310-n having data stored to memory pages P1 representing the first memory pages and to memory pages P2 representing the second memory pages. For these examples, the data stored to memory pages P1 may be a first XOR stripe identified in FIG. 3 as stripe 1 and the data stored to memory pages P2 may be a second XOR stripe identified in FIG. 3 as stripe 2.

In some examples, logic and/or features of a storage controller for a storage device that includes B-E dies 310-1 to 310-n and W-i-P die 320 may determine one or more physical memory addresses from among addresses 310-1 to 301-n to store XOR parity information generated based on data (XOR data) included in stripe 1 and stripe 2 at W-i-P die 320. The XOR parity information may then be caused by the logic and/or feature of the storage controller to be stored to the one or more physical memory addresses from among addresses 310-1 to 301-n of W-i-P die 320.

FIG. 4 illustrates an example scheme 400. As shown in FIG. 4, scheme 400 may depict a scheme for protection of data stored to B-E memory dies 410. B-E memory dies 410 may represent at least some B-E memory dies or devices included in a storage device such as an SSD. In some examples, as shown in FIG. 4, B-E dies 410-1 to 410-n may each include 4 planes identified as planes 0 to 3. Also, each memory page for individual planes are identified by as x0 to x7. For these examples, stripes N to N+7 may represent data to be XORed together spanning across planes included in B-E dies 410-1 to 410-n to generate XOR parity information p0 to p7. XOR parity information p0 to p7 may be stored to physical memory addresses 401-1 to 401-8 of W-i-P memory die 420.

According to some examples, as shown in FIG. 4, XOR parity information generated from stripes N to N+7 may be stored to separate physical memory addresses of W-i-P die 420. These separate physical memory addresses may include either contiguous or non-contiguous separate physical memory addresses. So as shown in FIG. 4, XOR parity information p0 to P7 corresponding to stripes N to N+7 may be stored to separate physical memory addresses 401-1 to 401-8. For these examples, the XOR parity information for a single XOR stripe stored to separate physical memory addresses may increase or provide a high level of protection for recovering data stored to memory pages of B-E dies 410-1 to 410-n responsive to an uncorrectable error to at least a portion of that data. However, a greater amount of W-i-P memory may be needed to provide this increased level of protection compared to storing XOR parity information for multiple stripes at a same physical memory address.

In some examples, a data structure such as a LUT may hold a mapping to indicate storing XOR parity information for p0 to p7 in physical memory addresses of W-i-P die 420. For example, the mapping may indicate storing p0 to address 401-1, p1 to address 401-2, p2 to address 401-3, p3 to address 401-4, p4 to address 401-5, p6 to address 401-6 and p7 to address 401-8. A storage controller for a storage device including B-E memory dies 410 and W-i-P die 420 may maintain the LUT during generation and storing of XOR parity information and may cause the XOR parity information to be stored according to this data structure. Also, the storage controller may cause a copy of the LUT to be stored to W-i-P die 420. This storage of the LUT to W-i-P die 420 may occur on a periodic basis or may occur responsive to implementation of a power fail event that causes a PLI mechanism to be implemented to facilitate data recovery following a power failure of the storage device.

According to some examples, storing XOR parity information for p0 to p7 to W-i-P die 420 may facilitate or result in more efficient garbage collection for data that has become stale at B-E memory dies 410 compared to storing the XOR parity information to a reserved plane of each B-E memory die. For example, if garbage collection was needed at stripe N, the XOR parity information generated before garbage collection (e.g., includes now stale data) may be XORed with data in stripe N that has the stale data removed. Therefore, even an incomplete stripe may be XOR protected. If a B-E memory die were used, all valid data (e.g., non-stale data) would need to be moved out of stripe N and new XOR parity information generated.

Figure 5:
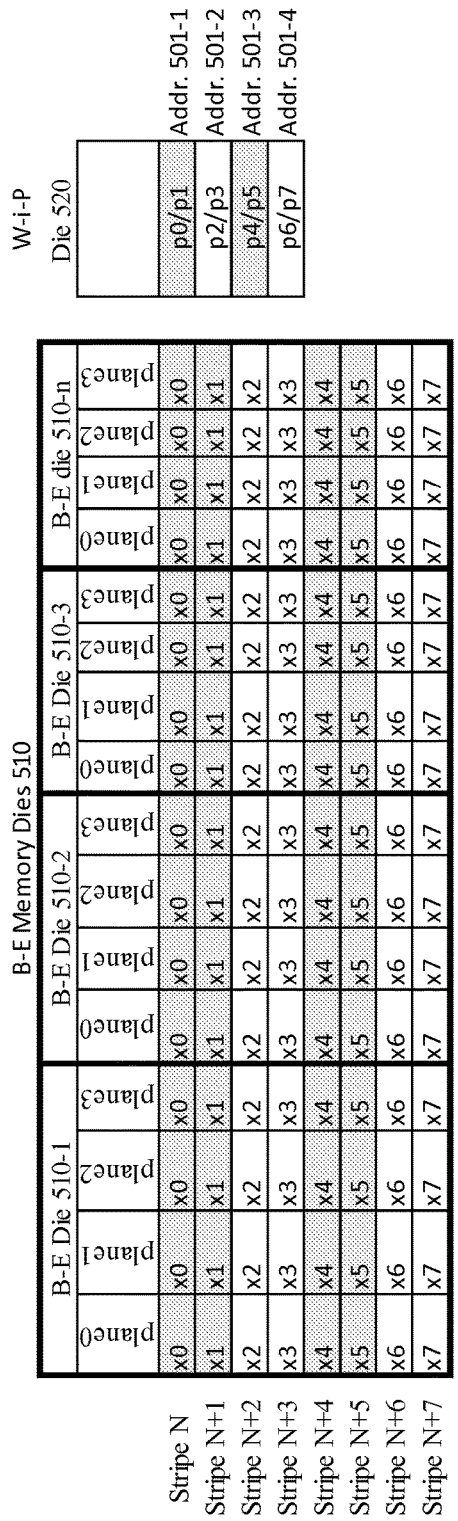
FIG. 5 illustrates an example third scheme.

FIG. 5 illustrates an example scheme 500. As shown in FIG. 5, scheme 500 may depict a scheme for protection of data stored to B-E memory dies 510. B-E memory dies 510 may represent at least some B-E memory dies or devices included in a storage device such as an SSD. In some examples, as shown in FIG. 5, B-E dies 510-1 to 510-n may each include 4 planes identified as planes 0 to 3. Also, each memory page for individual planes are identified by as x0 to x7. For these examples, stripes N to N+7 may represent data to be XORed together spanning across planes included in B-E dies 510-1 to 510-n to generate XOR parity information p0 to p7. XOR parity information p0 to p7 may be stored to physical memory addresses 501-1 to 501-4 of W-i-P memory die 520.

According to some examples, as shown in FIG. 5, XOR parity information generated from multiple XOR stripes may be stored to a same physical memory address of W-i-P die 520. In other words, the XOR parity information for two XOR stripes may be stored to the same physical memory address to use less memory capacity of the W-i-P memory included in W-i-P die 520. So as shown in FIG. 5, XOR parity information p0/p1 corresponding to stripes N and N+1 may be stored to address 501-1, XOR parity information p2/p3 corresponding to stripes N+2 and N+3 may be stored to address 501-2, XOR parity information p4/p5 corresponding to stripes N+4 and N+5 may be stored to address 501-3 and XOR parity information p6/p7 corresponding to stripes N+6 and N+7 may be stored to address 501-4. For these examples, the XOR parity information for two XOR stripes stored to the same physical memory address may decrease the amount of W-i-P memory used but may also reduce a level of protection for recovering data stored to memory pages of B-E dies 510-1 to 510-n responsive to an uncorrectable error to at least a portion of that data. This reduced protection may result from less XOR parity information being stored to protect the data.

In some examples, a data structure such as a LUT may hold a mapping to indicate storing XOR parity information for p0/p1, p2/p3, p4/p5 and p6/p7 in physical memory addresses of W-i-P die 520. For example, the mapping may indicate storing p0/p1 to address 501-1, p2/p3 to address 501-2, p4/p5 to address 501-3 and p6/p7 to address 501-4. A storage controller for a storage device including B-E memory dies 510 and W-i-P die 520 may maintain the LUT during generation and storing of XOR parity information and may cause the XOR parity information to be stored according to this data structure. Also, the storage controller may cause a copy of the LUT to be stored to W-i-P die 520. This storage of the LUT to W-i-P die 520 may occur on a periodic basis or may occur responsive to implementation of a power fail event that causes a PLI mechanism to be implemented to facilitate data recovery following a power failure of the storage device.

Figure 6:
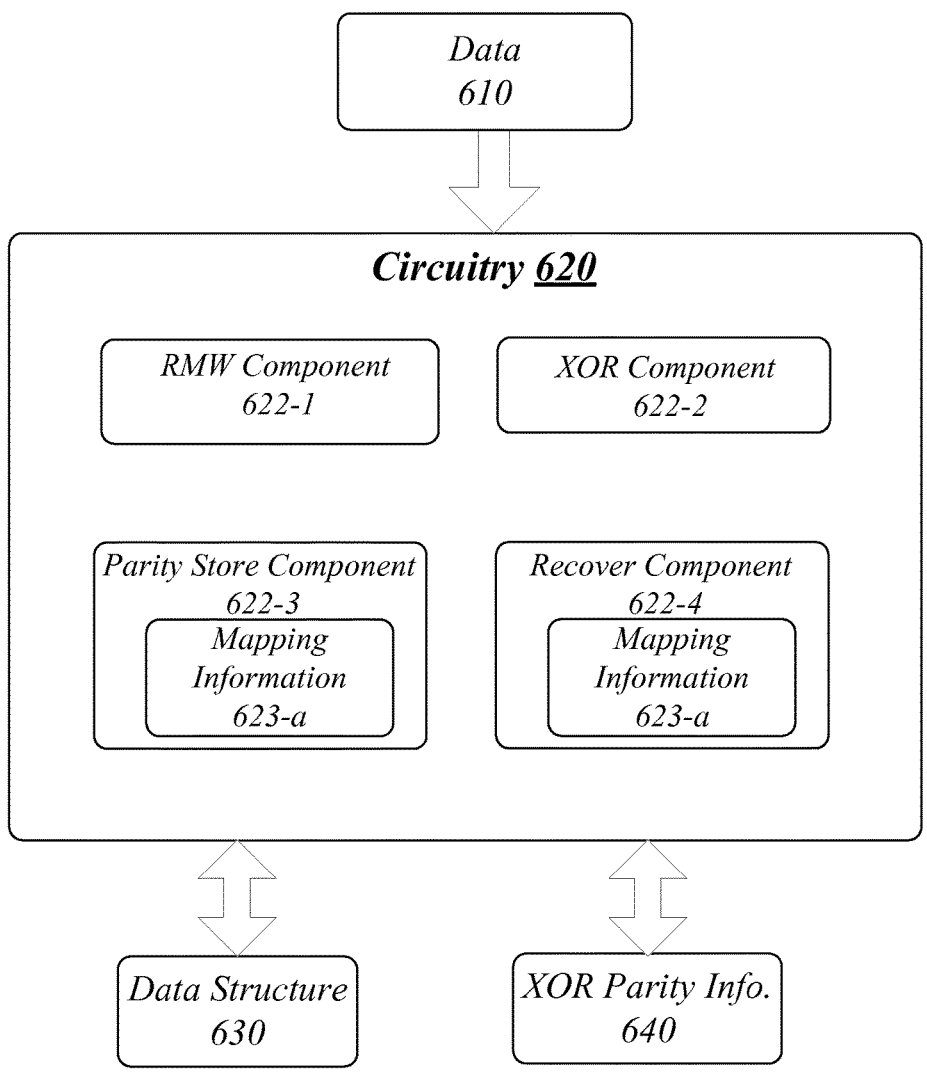
FIG. 6 illustrates an example block diagram for an apparatus.

FIG. 6 illustrates an example block diagram for an apparatus 600. Although apparatus 600 shown in FIG. 6 has a limited number of elements in a certain topology, it may be appreciated that the apparatus 600 may include more or less elements in alternate topologies as desired for a given implementation.

The apparatus 600 may be supported by circuitry 620 maintained at a storage device similar to storage device 102 of system 100 shown in FIG. 1. The storage device may be coupled to a host controller for host computing platform similar to host 101 also shown in FIG. 1. Circuitry 620 may be arranged to execute one or more software or firmware implemented components or modules 622-a (e.g., implemented, at least in part, by a storage controller and/or an XOR engine). It is worthy to note that "a" and "b" and "c" and similar designators as used herein are intended to be variables representing any positive integer. Thus, for example, if an implementation sets a value for a=4, then a complete set of software or firmware for components or modules 622-a may include components 622-1, 622-2, 622-3 or 622-4. The examples presented are not limited in this context and the different variables used throughout may represent the same or different integer values.

According to some examples, circuitry 620 may include a processor or processor circuitry. The processor or processor circuitry can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Atom®, Celeron®, Core (2) Duo®, Core i3, Core i5, Core i7, Itanium®, Pentium®, Xeon®, Xeon Phi® and XScale® processors; and similar processors. According to some examples circuitry 620 may also include one or more application specific integrated circuits (ASICs) and at least some components 622-$a$ may be implemented as hardware elements of these ASICs.

According to some examples, apparatus 600 may include a RMW component 622-1. RMW component 622-1 may be executed by circuitry 620 to store data to a plurality of B-E memory dies that individually include multiple memory planes, each memory plane including at least first and second memory pages to store the data. For these examples, the data to be stored may be included in data 610.

In some examples, apparatus 600 may also include an XOR component 622-2. XOR component 622-2 may be executed by circuitry 620 to generate XOR parity information based on data stored to first and second memory pages of a first number of planes spanning across more than one B-E memory die from among the plurality of B-E memory dies. For these examples, the data stored to the first and second memory pages may include first and second XOR stripes.

According to some examples, apparatus 600 may also include a parity store component 622-3. Parity store component 622-3 may be executed by circuitry 620 to store the XOR parity information for the first and second XOR stripes at one or more physical memory addresses of a W-i-P memory die. For these examples, parity store component 622-3 may have access to and/or maintain mapping information 623-$a$ in a data structure such as a LUT. The LUT may be included in data structure 630 and may indicate where XOR parity information included in XOR parity info. 640 may be stored for the first and second XOR stripes that were XORed together by XOR component 622-2.

In some examples, apparatus 600 may also include a recover component 622-4. Recover component 622-4 may be executed by circuitry 620 to recover data stored to the first or second memory pages using the XOR parity information stored to the W-i-P memory die. For these examples, the data may be recovered by recover component 622-4 responsive to an uncorrectable error to a portion of the data stored to the first or second memory pages. Also, for these examples, the LUT including mapping information 623-$a$ may have been stored to the W-i-P memory die and may be used to facilitate recovery of the portion of the data stored to the first or second memory pages.

Included herein is a set of logic flows representative of example methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, and/or hardware. In software and firmware embodiments, a logic flow may be implemented by computer executable instructions stored on at least one non-transitory computer readable medium or machine readable medium, such as an optical, magnetic or semiconductor storage. The embodiments are not limited in this context.

FIG. 7 illustrates an example of a logic flow 700. Logic flow 700 may be representative of some or all of the operations executed by one or more logic, features, or devices described herein, such as apparatus 600. More particularly, logic flow 700 may be implemented by RMW component 622-1, XOR component 622-2, parity store component 622-3 or recover component 622-4.

According to some examples, logic flow 700 at block 702 may store data to a plurality of B-E memory dies that individually include multiple memory planes, each memory plane including at least first and second memory pages to store the data. For these examples, RMW component 622-1 may store the data.

In some examples, logic flow 700 at block 704 may generate XOR parity information based on data stored to first and second memory pages of a first number of planes spanning across more than one B-E memory die from among the plurality of B-E memory die, the data stored to the first and second memory pages comprising first and second XOR stripes. For these examples, XOR component 622-2 may generate the XOR parity information.

According to some examples, logic flow 700 at block 706 may store the XOR parity information for the first and second XOR stripes at one or more physical memory addresses of a W-i-P memory die. For these examples, parity store component 622-3 may cause the XOR parity information to be stored to the one or more physical memory addresses of the W-i-P memory die.

In some examples, logic flow 700 at block 708 may recover data stored to the first or second memory pages using the XOR parity information stored to the W-i-P memory die, the data recovered responsive to an uncorrectable error to a portion of the data stored to the first or second memory pages. For these examples, recover component 622-4 may recover the data using the XOR parity information stored to the W-i-P memory.

FIG. 8 illustrates an example of a first storage medium. As shown in FIG. 8, the first storage medium includes a storage medium 800. The storage medium 800 may comprise an article of manufacture. In some examples, storage medium 800 may include any non-transitory computer readable medium or machine readable medium, such as an optical, magnetic or semiconductor storage. Storage medium 800 may store various types of computer executable instructions, such as instructions to implement logic flow 700. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 9:
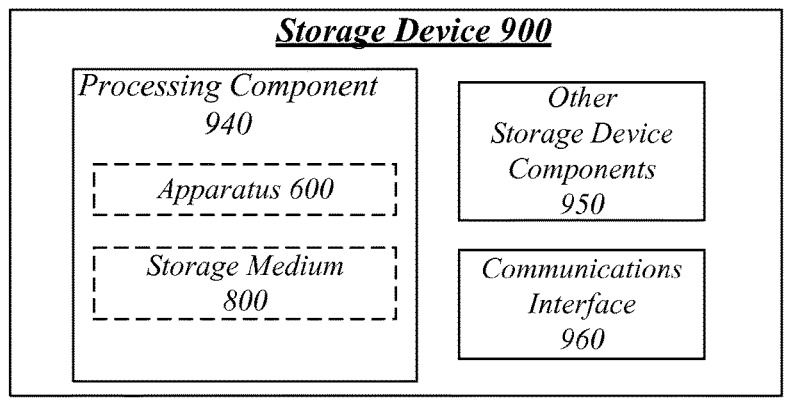
FIG. 9 illustrates an example storage device.

FIG. 9 illustrates an example storage device 900. In some examples, as shown in FIG. 9, storage device 900 may include a processing component 940, other storage device components 950 or a communications interface 960. According to some examples, storage device 900 may be capable of being coupled to a host controller resident in a computing platform as mentioned previously.

According to some examples, processing component 940 may execute processing operations or logic for apparatus 600 and/or storage medium 800. Processing component 940 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software components, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other storage device components 950 may include common computing elements or circuitry, such as one or more processors, multi-core processors, co-processors, memory units, chipsets, controllers, interfaces, oscillators, timing devices, power supplies, and so forth. Examples of memory units may include without limitation various types of computer readable and/or machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, and any other type of storage media suitable for storing information.

In some examples, communications interface 960 may include logic and/or features to support a communication interface. For these examples, communications interface 960 may include one or more communication interfaces that operate according to various communication protocols or standards to communicate over direct or network communication links. Direct communications may occur via use of communication protocols or standards described in one or more industry standards (including progenies and variants) such as those associated with the SMBus specification, the PCI Express specification and/or the Non-Volatile Memory Express (NVMe) specification. Network communications may occur via use of communication protocols or standards such those described in one or more Ethernet standards promulgated by the Institute of Electrical and Electronics Engineers (IEEE). For example, one such Ethernet standard may include IEEE 802.3-2008, Carrier sense Multiple access with Collision Detection (CSMA/CD) Access Method and Physical Layer Specifications, Published in December 2008 ("IEEE 802.3").

Storage device 900 may be arranged as an SSD that includes a plurality of B-E memory dies or devices to store data and may also include a W-i-P memory die or device to store XOR parity information as described above for systems 100 and 200 or for schemes 200, 300 or 400. Accordingly, functions and/or specific configurations of storage device 900 described herein, may be included or omitted in various embodiments of storage device 900, as suitably desired.

The components and features of storage device 900 may be implemented using any combination of discrete circuitry, application specific integrated circuits (ASICs), logic gates and/or single chip architectures. Further, the features of storage device 900 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the example storage device 900 shown in the block diagram of FIG. 9 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

Figure 10:
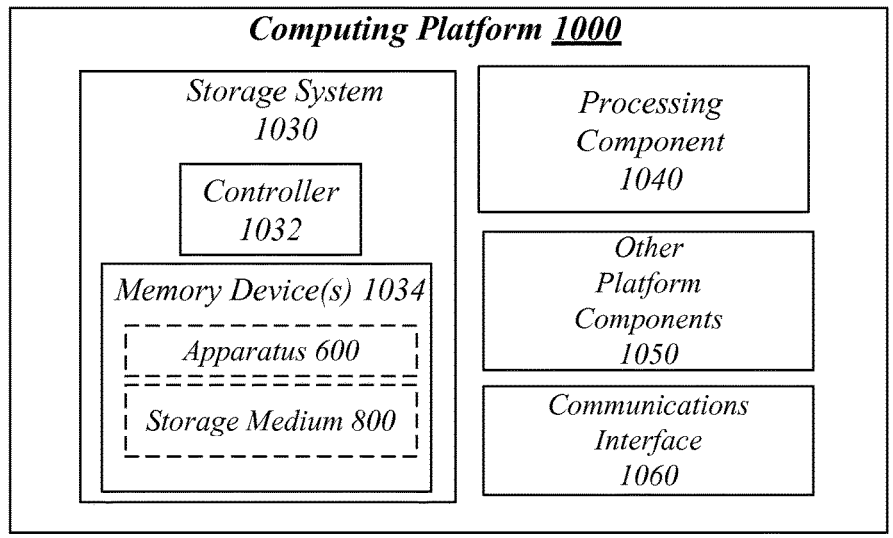
FIG. 10 illustrates an example computing platform.

FIG. 10 illustrates an example computing platform 1000. In some examples, as shown in FIG. 10, computing platform 1000 may include a storage system 1030, a processing component 1040, other platform components 1050 or a communications interface 1060. According to some examples, computing platform 1000 may be implemented in a computing device.

According to some examples, storage system 1030 may be similar to system 100 and includes a controller 1032 and memory devices(s) 1034. For these examples, logic and/or features resident at or located with controller 1032 may execute at least some processing operations or logic for apparatus 600 and may include storage media that includes storage medium 800. Also, memory device(s) 1034 may include similar types of volatile or non-volatile memory (not shown) that are described above for storage device 900 shown in FIG. 9.

According to some examples, processing component 1040 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, ASIC, PLD, DSP, FPGA, memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 1050 may include common computing elements, such as one or more processors, multi-core processors, co-processors, memory units, chipsets, controllers, peripherals, interfaces, oscillators, timing devices, video cards, audio cards, multimedia I/O components (e.g., digital displays), power supplies, and so forth. Examples of memory units associated with either other platform components 1050 or storage system 1030 may include without limitation, various types of computer readable and machine readable storage media in the form of one or more higher speed memory units, such as ROM, RAM, DRAM, DDRAM, SDRAM, SRAM, PROM, EPROM, EEPROM, flash memory, nanowires, FeTRAM, FeRAM, polymer memory such as ferroelectric polymer memory, ovonic memory, 3-dimensional cross-point memory or ferroelectric memory, SONOS memory, nanowire, magnetic or optical cards, an array of devices such as RAID drives, solid state memory devices (e.g., USB memory), SSD and any other type of storage media suitable for storing information.

In some examples, communications interface 1060 may include logic and/or features to support a communication interface. For these examples, communications interface 1060 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification. Network communications may occur through a network interface via use of communication protocols or standards such as those described in one or more Ethernet standards promulgated by the IEEE. For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3").

Computing platform 1000 may be part of a computing device that may be, for example, user equipment, a computer, a personal computer (PC), a desktop computer, a laptop computer, a notebook computer, a netbook computer, a tablet, a smart phone, embedded electronics, a gaming console, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 1000 described herein, may be included or omitted in various embodiments of computing platform 1000, as suitably desired.

The components and features of computing platform 1000 may be implemented using any combination of discrete circuitry, ASICs, logic gates and/or single chip architectures. Further, the features of computing platform 1000 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations may be stored on a tangible, machine readable medium and supplied to various customers or manufacturing facilities to load into the fabrication machines that actually make the logic or processor.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

Some examples may include an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/ or interpreted programming language.

Some examples may be described using the expression "in one example" or "an example" along with their derivatives. These terms mean that a particular feature, structure, or characteristic described in connection with the example is included in at least one example. The appearances of the phrase "in one example" in various places in the specification are not necessarily all referring to the same example.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The follow examples pertain to additional examples of technologies disclosed herein.

Example 1

An example apparatus may include a plurality of block-erasable memory devices. The apparatus may also include a 3-D cross-point memory device. The apparatus may also include an exclusive XOR engine, at least a portion of the XOR engine in hardware, the XOR engine to generate XOR parity information for use to recover data stored to the plurality of block-erasable memory devices and cause the generated XOR parity information to be stored to the write-in-place memory device.

Example 2

The apparatus of example 1, the plurality of block-erasable memory devices may include a plurality of NAND memory dies and the write-in-place memory device comprising a 3-D cross-point memory die.

Example 3

The apparatus of example 2, individual NAND memory dies of the plurality of NAND memory dies may include multiple NAND planes. For these examples, the XOR parity information may be generated by the XOR engine based on a first number of NAND planes of more than one individual NAND memory die having data stored to first memory pages for the first number of planes XORed together and having data stored to second memory pages for the first number of planes XORed together. The data stored to the first and second memory pages may include respective first and second XOR stripes.

Example 4

The apparatus of example 3 may also include a storage controller, at least a portion of the storage controller in hardware, the storage controller may determine one or more physical memory addresses in the 3-D cross-point memory die to store XOR parity information generated by the XOR engine for the first and second XOR stripes. The storage controller may also cause the XOR parity information to be stored to the one or more physical memory addresses.

Example 5

The apparatus of example 4, the storage controller may determine the one or more physical memory addresses based on a data structure that indicates a mapping of the XOR parity information generated by the XOR engine for storing XOR parity information to the one or more physical memory addresses in the 3-D cross-point memory die.

Example 6

The apparatus of example 5, the mapping may indicate storing the XOR parity information for the first and second XOR stripes XORed together to separate physical memory addresses in order to increase a protection level to recover data stored to the plurality of NAND memory dies.

Example 7

The apparatus of example 6, the separate physical memory addresses may include non-contiguous separate physical memory addresses.

Example 8

The apparatus of example 5, the storage controller may cause the data structure that indicates the mapping of the XOR parity information to be stored in the 3-D cross-point memory die.

Example 9

The apparatus of example 1 may also include a transfer buffer that includes volatile memory. The volatile memory may at least temporarily store the XOR parity information generated by the XOR engine prior to the XOR parity information being stored to the write-in-place memory die.

Example 10

The apparatus of example 9, the volatile memory may include static random access memory (SRAM).

Example 11

An example method implemented at a storage device may include storing data to a plurality of block-erasable memory devices that individually include multiple memory planes, each memory plane including at least first and second memory pages to store the data. The method may also include generating exclusive XOR parity information based on data stored to first and second memory pages of a first number of planes spanning across more than one block-erasable memory device from among the plurality of block-erasable memory devices. The data stored to the first and second memory pages may include first and second XOR stripes. The method may also include storing the XOR parity information for the first and second XOR stripes at one or more physical memory addresses of a write-in-place memory device.

Example 12

The method of example 11, the plurality of block erasable memory devices may be a plurality of NAND memory dies and the write in place memory device may be a 3-D cross-point memory die.

Example 13

The method of example 11 may also include recovering data stored to the first or second memory pages using the XOR parity information stored to the write-in-place memory device. For these examples, the data may be recovered responsive to an uncorrectable error to a portion of the data stored to the first or second memory pages.

Example 14

The method of example 11 may also include storing the XOR parity information for the first and second XOR stripes at the one or more physical memory addresses of the write-in-place memory device based on a data structure that indicates a mapping of the XOR parity information to the one or more physical memory addresses.

Example 15

The method of example 14, the mapping may indicate storing the XOR parity information for the first and second XOR stripes XORed together to a same physical memory address in order to decrease an amount of write-in-place memory of the write-in-place memory device used to store XOR parity information for the first and second XOR stripes that are XORed together.

Example 16

The method of example 14 may also include causing the data structure that indicates the mapping of the XOR parity information to be stored to the write-in-place memory device.

Example 17

The method of example 16, the data structure may include a lookup table capable of being saved to the write-in-place memory device responsive to a power fail event using a PLI mechanism.

Example 18

The method of example 11 may also include storing, at least temporarily, the XOR parity information at a transfer buffer including volatile memory prior to storing the XOR parity information to the write-in-place memory device.

Example 19

An example at least one machine readable medium may include a plurality of instructions that in response to being executed by system at a host computing platform cause the system to carry out a method according to any one of examples 11 to 18.

Example 21

An example apparatus may include means for performing the examples of any one of examples 11 to 18.

Example 21

An example at least one machine readable medium may include a plurality of instructions that in response to being executed on system at a storage device may cause the system to store data to a plurality of block-erasable memory dies that individually include multiple memory planes. Each memory plane may include at least first and second memory pages to store the data. The instructions may also cause the system to generate exclusive XOR parity information based on data stored to first and second memory pages of a first number of planes spanning across more than one block-erasable memory die from among the plurality of block-erasable memory die. The data stored to the first and second memory pages may include first and second XOR stripes. The instructions may also cause the system to store the XOR parity information for the first and second XOR stripes at one or more physical memory addresses of a write-in-place memory die.

Example 22

The at least one machine readable medium of example 21, the plurality of block erasable memory devices may be a plurality of NAND memory dies and the write in place memory device may be a 3-dimensional (3-D) cross-point memory die.

Example 23

The at least one machine readable medium of example 21, the instructions may further cause the system to recover data stored to the first or second memory pages using the XOR parity information stored to the write in place memory die. For these examples, the data may be recovered responsive to an uncorrectable error to a portion of the data stored to the first or second memory pages.

Example 24

The at least one machine readable medium of example 21, the instructions may further cause the system to store the XOR parity information for the first and second XOR stripes at the one or more physical memory addresses of the write in place die based on a data structure that indicates a mapping of the XOR parity information to the one or more physical memory addresses.

Example 25

The at least one machine readable medium of example 24, the data structure mapping may indicate storing the XOR parity information for the first and second XOR stripes XORed together to a same physical memory address in order to decrease an amount of 3 write in place memory of the write in place memory die used to store XOR parity information for the first and second XOR stripes that are XORed together, and to also to decrease a protection level to recover data stored to the plurality of NAND memory dies.

Example 26

The at least one machine readable medium of example 24, the instructions may further cause the system to store the data structure that indicates the mapping of the XOR parity information to the write in place memory die.

Example 27

The at least one machine readable medium of example 26, the data structure may include a lookup table capable of being saved to the write in place memory die responsive to a power fail event using a PLI mechanism.

Example 28

The at least one machine readable medium of example 21, the instructions may further cause the system to store, at least temporarily, the XOR parity information at a transfer buffer including volatile memory prior to causing the XOR parity information to be stored to the write in place memory die.

Example 29

An example system may include a processor for a computing platform. The system may also include a storage device coupled with the computing platform. For these examples, the storage device may include a storage controller, at least a portion of the storage controller in hardware. The storage device may also include a plurality of block-erasable memory devices. The storage device may also include a write-in-place memory device. The storage device may also include an exclusive OR (XOR) engine, at least a portion of the XOR engine in hardware, the XOR engine to generate XOR parity information for use to recover data stored to the plurality of block-erasable memory devices and cause the generated XOR parity information to be stored to the write-in-place memory device.

Example 30

The system of example 29, the plurality of block erasable memory devices may be a plurality of NAND memory dies and the write in place memory device may be a 3-D cross-point memory die.

Example 31

The system of example 29, individual NAND memory dies of the plurality of NAND memory dies may include multiple NAND planes. The XOR parity information may be generated by the XOR engine based on a first number of NAND planes of more than one individual NAND memory die having data stored to first memory pages for the first number of planes XORed together and having data stored to second memory pages for the first number of planes XORed together. The data stored to the first and second memory pages may include respective first and second XOR stripes.

Example 32

The system of example 31, the storage controller may determine one or more physical memory addresses in the 3-D cross-point memory die to store XOR parity information generated by the XOR engine for the first and second XOR stripes. The storage controller may also cause the XOR parity information to be stored to the one or more physical memory addresses.

Example 32

The system of example 32, the storage controller may determine the one or more physical memory addresses based on a data structure that indicates a mapping of the XOR parity information generated by the XOR engine for storing XOR parity information to the one or more physical memory addresses in the 3-D cross-point memory die.

Example 34

The system of example 33, the mapping may indicate storing the XOR parity information for the first and second XOR stripes XORed together to separate physical memory addresses in order to increase a protection level to recover data stored to the plurality of NAND memory dies.

Example 35

The system of example 32, the storage controller may cause the data structure that indicates the mapping of the XOR parity information to be stored in the write-in-place memory die.

Example 36

The system of example 29 may also include a transfer buffer including volatile memory to at least temporarily store the XOR parity information generated by the XOR engine prior to the XOR parity information being stored to the 3-D cross-point memory die.

Example 37

The system of example 29 may also include a digital display coupled with the processor to present a user interface view.

It is emphasized that the Abstract of the Disclosure is provided to comply with 37 C.F.R. Section 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single example for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus the following claims are hereby incorporated into the Detailed Description, with each claim standing on its own as a separate example. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. An apparatus comprising:
  a plurality of block-erasable memory devices having at least a first and a second memory page;
  a write-in-place memory device; and an exclusive OR (XOR) engine, at least a portion of the XOR engine in hardware, the XOR engine to generate XOR parity information based on data stored to the first and the second memory pages of a first number of planes spanning across more than one block-erasable memory device from among the plurality of block-erasable memory devices, the data stored to the first and second memory pages comprising at least first and second XOR stripes and cause the XOR parity information for the first and second XOR stripes to be XORed together to a same physical memory address of the write-in-place memory device based on a data structure that indicates a mapping of the XOR parity information to one or more physical memory addresses.

2. The apparatus of claim 1, the plurality of block erasable memory devices comprising a plurality of NAND memory dies and the write in place memory device comprising a 3-D cross-point memory die.

3. The apparatus of claim 2, individual NAND memory dies of the plurality of NAND memory dies including multiple NAND planes, the XOR parity information generated by the XOR engine based on a first number of NAND planes of more than one individual NAND memory die having data stored to the first memory pages for the first number of NAND planes XORed together and having data stored to the second memory pages for the first number of NAND planes XORed together, the data stored to the first and second memory pages comprising respective first and second XOR stripes.

4. The apparatus of claim 3, comprising:
a storage controller, at least a portion of the storage controller in hardware, the storage controller to:
determine one or more physical memory addresses in the 3-D cross-point memory die to store XOR parity information generated by the XOR engine for the first and second XOR stripes; and
cause the XOR parity information to be stored to the one or more physical memory addresses.

5. The apparatus of claim 4, the storage controller to determine the one or more physical memory addresses based on a data structure that indicates a mapping of the XOR parity information generated by the XOR engine for storing XOR parity information to the one or more physical memory addresses in the 3-D cross-point memory die.

6. The apparatus of claim 5, the mapping to indicate storing the XOR parity information for third and fourth XOR stripes XORed together to a separate physical memory address in order to increase a protection level to recover data stored to the plurality of NAND memory dies.

7. The apparatus of claim 6, the data structure to comprise a lookup table capable of being saved to the write-in-place memory device responsive to a power fail event via a power loss imminent (PLI) mechanism.

8. The apparatus of claim 5, the storage controller to cause the data structure that indicates the mapping of the XOR parity information to be stored in the 3-D cross-point memory die.

9. The apparatus of claim 1, comprising a transfer buffer including volatile memory to at least temporarily store the XOR parity information generated by the XOR engine prior to the XOR parity information being stored to the write-in-place memory device.

10. A method implemented at a storage device comprising:
storing data to a plurality of block-erasable memory devices that individually include multiple memory planes, each memory plane including at least first and second memory pages to store the data;
generating exclusive OR (XOR) parity information based on data stored to first and second memory pages of a first number of planes spanning across more than one block-erasable memory device from among the plurality of block-erasable memory devices, the data stored to the first and second memory pages comprising first and second XOR stripes; and
storing the XOR parity information for the first and second XOR stripes at one or more physical memory addresses of a write-in-place memory device based on a data structure that indicates a mapping of the XOR parity information to the one or more physical memory addresses, the mapping to indicate storing the XOR parity information for the first and second XOR stripes XORed together to a same physical memory address in order to decrease an amount of write-in-place memory of the write-in-place memory device used to store XOR parity information for the first and second XOR stripes that are XORed together.

11. The method of claim 10, the plurality of block erasable memory devices comprising a plurality of NAND memory dies and the write in place memory device comprising a 3-D cross-point memory die.

12. The method of claim 10, comprising:
recovering data stored to the first or second memory pages using the XOR parity information stored to the write-in-place memory device, the data recovered responsive to an uncorrectable error to a portion of the data stored to the first or second memory pages.

13. The method of claim 10, comprising:
causing the data structure that indicates the mapping of the XOR parity information to be stored to the write-in-place memory device.

14. The method of claim 13, the data structure comprising a lookup table capable of being saved to the write-in-place memory device responsive to a power fail event using a power loss imminent (PLI) mechanism.

15. The method of claim 11, comprising:
storing, at least temporarily, the XOR parity information at a transfer buffer including volatile memory prior to storing the XOR parity information to the 3-D cross-point memory device.

16. A system comprising:
a processor for a computing platform;
a storage device coupled with the computing platform, the storage device including:
a storage controller, at least a portion of the storage controller in hardware;
a plurality of block-erasable memory devices having first and second memory pages;
a write-in-place memory device; and
an exclusive OR (XOR) engine, at least a portion of the XOR engine in hardware, the XOR engine to generate XOR parity information based on data stored to the first and the second memory pages of a first number of planes spanning across more than one block-erasable memory device from among the plurality of block-erasable memory devices, the data stored to the first and second memory pages, the XOR parity information comprising at least first and second XOR stripes and cause the XOR parity information for the first and second XOR stripes to be XORed together to a same physical memory address of the write-in-place memory device based on a data structure that indicates a mapping of the XOR parity information to one or more physical memory addresses.

17. The system of claim 16, the plurality of block erasable memory devices comprising a plurality of NAND memory dies and the write in place memory device comprising a 3-D cross-point memory die.

18. The system of claim 17, individual NAND memory dies of the plurality of NAND memory dies including multiple NAND planes, the XOR parity information generated by the XOR engine based on a first number of NAND planes of more than one individual NAND memory die having data stored to the first memory pages for the first number of NAND planes XORed together and having data stored to the second memory pages for the first number of NAND planes XORed together, the data stored to the first and second memory pages comprising respective first and second XOR stripes.

19. The system of claim 18, comprising the storage controller to:
determine one or more physical memory addresses in the 3-D cross-point memory die to store XOR parity information generated by the XOR engine for the first and second XOR stripes; and
cause the XOR parity information to be stored to the one or more physical memory addresses.

20. The system of claim 19, the storage controller to determine the one or more physical memory addresses based on a data structure that indicates a mapping of the XOR parity information generated by the XOR engine for storing XOR parity information to the one or more physical memory addresses in the 3-D cross-point memory die, the mapping to indicate storing the XOR parity information for the first and second XOR stripes XORed together to separate physical memory addresses in order to increase a protection level to recover data stored to the plurality of NAND memory dies.

21. The system of claim 20, the storage controller to cause the data structure that indicates the mapping of the XOR parity information to be stored in the write-in-place memory device.

22. The system of claim 17 comprising a transfer buffer including volatile memory to at least temporarily store the XOR parity information generated by the XOR engine prior to the XOR parity information being stored to the 3-D cross-point memory die.

23. The system of claim 16, comprising a digital display coupled with the processor to present a user interface view.

* * * * *